(12) United States Patent
Dishman et al.

(10) Patent No.: US 7,924,045 B2
(45) Date of Patent: Apr. 12, 2011

(54) APPARATUS, SYSTEM, AND METHOD FOR ERROR DETECTION IN A STAND ALONE POWER SUPPLY

(75) Inventors: Cecil C. Dishman, Raleigh, NC (US); Jen-Ching Lin, Apex, NC (US); Eino A. Lindfors, Raleigh, NC (US); Randhir S. Malik, Cary, NC (US); Dale W. Wilhite, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 12/171,461

(22) Filed: Jul. 11, 2008

(65) Prior Publication Data
US 2010/0007370 A1 Jan. 14, 2010

(51) Int. Cl.
*G01R 31/36* (2006.01)
(52) U.S. Cl. ........................................................ 324/771
(58) Field of Classification Search .................. 324/771; 714/22
See application file for complete search history.

(56) References Cited

U.S. PATENT DOCUMENTS

| | | | |
|---|---|---|---|
| 4,394,647 A | 7/1983 | Van Dine | |
| 4,403,213 A | 9/1983 | Khamare et al. | |
| 5,327,435 A | 7/1994 | Warchol | |
| 5,481,730 A | 1/1996 | Brown et al. | |
| 5,519,832 A | 5/1996 | Warchol | |
| 6,115,822 A | 9/2000 | Kim et al. | |
| 6,502,044 B1 | 12/2002 | Lane et al. | |
| 6,957,161 B2 * | 10/2005 | Allen et al. | 702/108 |
| 7,000,147 B2 * | 2/2006 | Hsu | 714/22 |
| 7,216,241 B2 * | 5/2007 | Babb et al. | 713/300 |
| 7,233,161 B2 * | 6/2007 | Zettler | 324/763 |

FOREIGN PATENT DOCUMENTS

| | | |
|---|---|---|
| WO | 02101554 A2 | 12/2002 |
| WO | WO02101554 | 12/2002 |

OTHER PUBLICATIONS

Malik et al., Apparatus, System, and Method for Event, Time, and Failure State, IBM Patent Disclosure, Sep. 28, 2007.

\* cited by examiner

*Primary Examiner* — Roberto Velez
(74) *Attorney, Agent, or Firm* — Kunzler Needham Massey & Thorpe

(57) ABSTRACT

An apparatus for error checking in a power supply includes a power module that determines that the power supply is in a self-test condition. The self-test condition involves the power supply being connected to an input power source while it is disconnected from the electronic load that it normally services. A load module connects an internal test load to the power supply when the power supply is in self-test condition, and an error checking module performs error check operations on the power supply while it is connected to the test load. The apparatus also includes a notify module that actuates an indicator when the error checking module determines that there are one or more faults in the power supply. The apparatus may also include a log module for storing error messages and reports in non-volatile memory.

18 Claims, 6 Drawing Sheets

APPARATUS, SYSTEM, AND METHOD FOR ERROR DETECTION IN A STAND ALONE POWER SUPPLY

BACKGROUND OF THE INVENTION

1. Field of the Invention

This invention relates to the field of power supplies, and particularly to detecting errors in a stand-alone power supply using an internal test load.

2. Description of the Related Art

Even the most well-designed power supply is destined to fail, as is any system that it powers. They do not, however, necessarily fail at the same time. When one or the other fails, it can be challenging to tell where the real problem lies—in the system, or in the power supply. For example, many power supplies include two light-emitting diodes ("LEDs")—an alternating current ("AC") LED indicator and a direct current ("DC") LED indicator. The AC LED is lit when the power supply is properly connected to an AC power source and is receiving expected power from it. The DC LED is lit when the power supply is operating normally and providing an expected power to the attached system.

When the DC LED is off, most customers generally assume that the problem is with the power supply; however, if the system overloads the power supply, short circuits, experiences fan blockage, or has code errors that direct the power supply off, the apparent problem with the power supply may actually be in the system. As a result, a customer might send the power supply back to the manufacturer for repair when, in fact, the power supply is operational and the system is experiencing errors.

These occurrences of "No Defect Found," or NDF, present a serious problem. NDF rates can run as high 45% to 55% of all power supplies that are returned. Having such a high rate costs companies millions in services charges, time, shipping costs, and other associated expenses. In addition, it can be immensely frustrating to customers who receive a new or repaired power supply and insert it into the system, only to discover that the problems continue. It may take a number of return-and-replace cycles before the manufacturer or the customer realizes that the problem is not the power supply, but the system itself.

Existing solutions generally involve having the power supplies sent back to a service center where the power supple is extensively tested. As noted above, this imposes significant costs on the company and time costs on the consumer. Alternatively, companies have technicians go to the customer's site and diagnose the power supply using a sophisticated I²C communication error diagnostic tool. Again, this solution imposes a significant cost in terms of service times and expensive diagnostic tools. What is needed is an apparatus, system, and method that enables a customer or technician to quickly and effectively diagnose a power supply without incurring the substantial costs described above.

BRIEF SUMMARY OF THE INVENTION

The present invention has been developed in response to the present state of the art, and in particular, in response to the problems and needs in the art that have not yet been fully solved by currently available power reduction technologies. Accordingly, the present invention provides a process, apparatus, and system for reducing the idle power in a power supply that overcomes many or all of the above-discussed shortcomings in the art.

The apparatus for error checking in a power supply is provided with a logic unit containing a plurality of modules configured to functionally execute the necessary steps for internal error checking. The modules include a power module that determines that the power supply is in a self-test condition, where the self-test condition involves the power supply being connected to an input power source while the power supply is disconnected from an electronic load. Being disconnected from the electronic load may include the power supply being physically removed from the electronic load and the power supply being electrically disconnected from the electronic load. For example, the power supply may be electrically disconnected by a switch while it remains physically connected to the electronic load.

The apparatus also includes a load module that connects a test load to the power supply when the power module determines that the power supply is in the self test condition. This test load is internal to the power supply.

The apparatus may also include an error checking module that performs error checking operations on the power supply when it is connected to the test load. The error checking operations determine whether or not there are one or more faults in the power supply. These error check operations may include an operation for determining whether the power supply is providing an expected regulated voltage value at the output terminal of the power supply while it is connected to the test load. The apparatus also includes a notify module that actuates an indicator when the error check module determines that there are faults present in the power supply.

In one embodiment, the apparatus also includes a connection module that determines whether the power supply is connected to, or disconnected from, the electronic load and provides a self-test signal when the power supply is disconnected from the electronic load. The power module determines that the power supply is in self-test condition in response to receiving the self-test signal from the connection module while the power supply is connected to the input power source.

The apparatus may additionally include an AC indicator that is actuated when an AC input is present. A DC indicator is actuated when the power supply is providing an expected DC output to a load such as the electronic load or the test load. In such an embodiment, the notify module may actuate the DC indicator when the error checking module determines that one or more faults are present in the power supply. Where the DC indicator is an LED, actuating the DC indicator may be setting the DC indicator LED to its off state. The apparatus may also include a log module that records error messages reported when the power supply is connected to the electronic load or the test load in non-volatile memory.

Also disclosed is a system for error checking in a power supply. The system includes a power supply that provides a regulated output voltage to an electronic load. The system further includes a test load, a power module, a connection module, a load module, an error checking module, and a notify module as described above. The system may also include the electronic load that connects to the power supply and receives as input the regulated output voltage of the power supply. This electronic load may be, for example, a computer, a blade system, or an appliance. In various embodiments, the power supply may receive as its input a direct current or alternating current input. Similarly, the power supply may provide a direct current or an alternating current output.

Further disclosed is a computer program product having instructions stored in a computer readable medium for checking a power supply for errors. The computer program product may include instructions for determining that the power supply is in a self-test condition, connecting a test load internal to a power supply to the output terminal of the power supply when it is in self-test condition, performing error checking operations, and actuating an indicator to alert a user to the presence of errors as discussed above. The computer program product may be implemented in a microcontroller of a power supply.

The application further discloses a method for checking a power supply for errors including substantially the steps described above. In addition, the application discloses a method for determining that a power supply having internal error checking needs repair. This method includes determining that the DC indicator LED of the power supply is off when the power supply is connected to the electronic load. The power supply is removed from the electronic load and the power supply is connected to the input power source while the power supply is disconnected from the electronic load such that the power supply is in the self-test condition described above. If the DC indicator LED is off, the power supply is deemed to be in need of repair.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module. Where the modules are implemented in software, they are generally stored in computer readable media and are executable by a processor.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Figure 1:
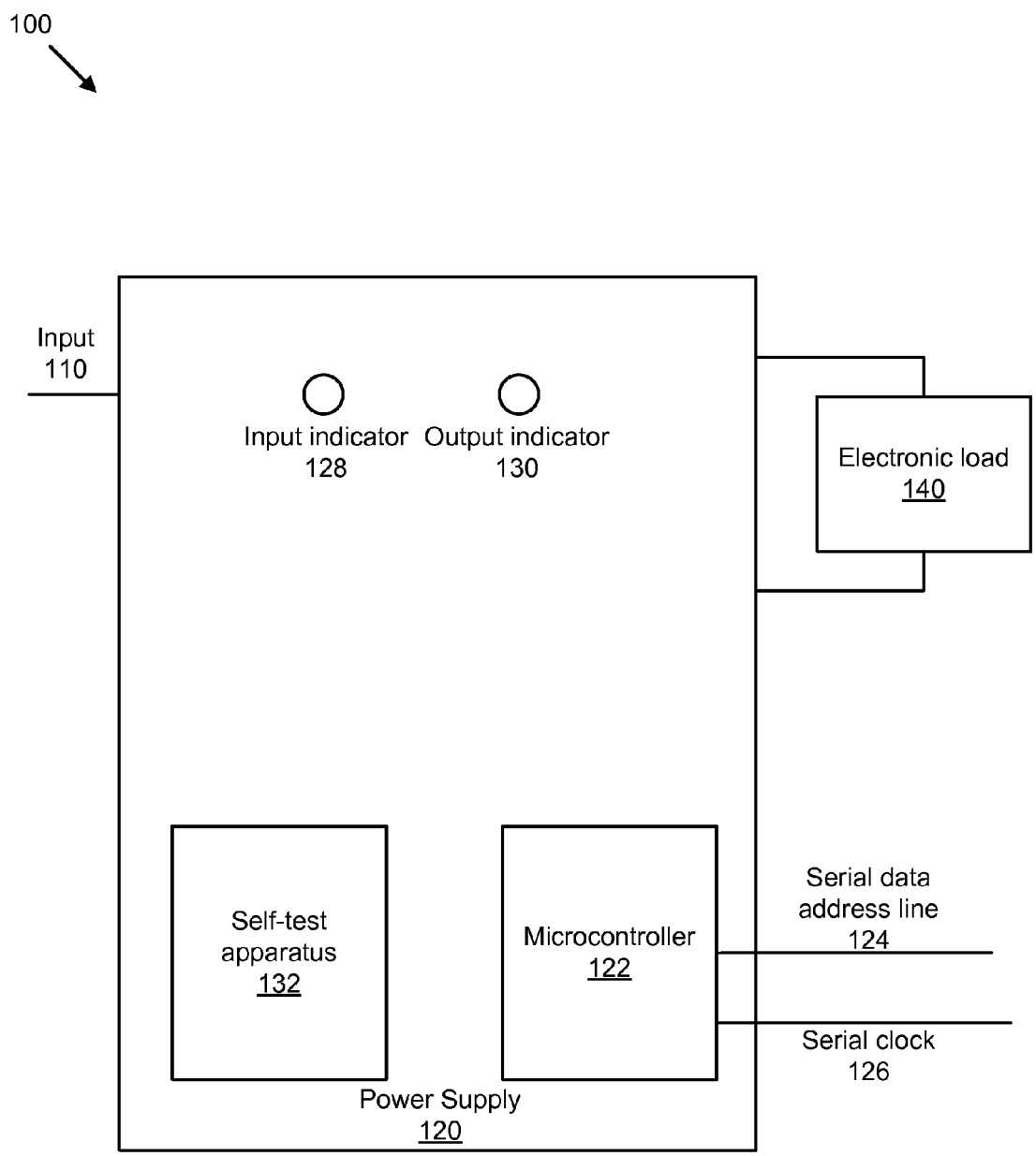
FIG. 1 is a schematic block diagram illustrating one embodiment of a power supply system in accordance with the present invention.

FIG. 1 depicts a schematic block diagram of a system 100 including a power supply 120 and an electronic load 140. The power supply 120 receives an input 110 and provides output to the electronic load 140. The input 110 may be an input voltage of approximately 120 Volts at 60 Hz from a standard wall socket in North America. Of course, the voltage and the frequency may vary based on region and the nature of the electrical load 140. For example, if the electrical load 140 is a large appliance, the input 110 may be a 240V connection. In addition, the input 110 may be either a direct current or an alternating current source. Those of skill in the art will appreciate that the power supply 120 may be configured to utilize a wide variety of inputs 110 based on location and system requirements.

The power supply 120 receives the input 110 and produces a regulated output voltage for the electronic load 140 which connects to an output terminal of the power supply 120. The power supply 120 may, in certain embodiments, be a DC to DC power supply, an AC to DC power supply, a DC to AC power supply, or other configuration known to those in the art.

In one embodiment, the power supply 120 also includes an input indicator 128 and an output indicator 130. The input indicator 128 is activated when the power supply 120 is receiving the input 110 and the input 110 is at expected values. The input indicator 128 may be an LED which is lit when an AC input 110 is providing expected energy to the power supply 120. Similarly, the output indicator 130 is activated when the power supply 120 is providing an expected output to the electronic load 140. In one embodiment, the output is measured at the output terminals of the power supply 120. The output indicator 130 may be an LED that is lit when the power supply 120 is providing an expected output to the electronic load 140. Thus, when the output indicator 130 is off, a problem exists either in the power supply 120 or in the electronic load 140 such that the power supply 120 is not providing an expected output. The input indicator 128 and output indicator 130 thus provide a user with the information necessary to determine whether there is a problem in providing power to the electronic load 140.

The power supply 120 also includes a microcontroller 122 configured to perform a variety of management and maintenance operations for the power supply 120. For example, the microcontroller 122 may monitor the input 110 and the output and activate the input indicator 128 and the output indicator 130 when the input or output value falls outside an acceptable range. The microcontroller 122 may have additional responsibilities in the power supply 120 such as ensuring that a regulated DC output is provided to the electronic load 140.

In addition, the microcontroller 122 may communicate with a larger system through the serial data address line ("SDA") 124. For example, the electronic load 140 may communicate with the microcontroller 122 through the SDA 124. Certain electronic loads 140 (such as a blade center, for example) are often designed to communicate with the power supply 120 and send a signal to turn off the power supply 120 for a variety of reasons, such as an error or problem in the electronic load 140. The microcontroller 122 receives these signals and takes appropriate action in the power supply 120.

In accordance with the present invention, the power supply 120 also includes a self-test apparatus 132 that performs error check operations on the power supply 120 when the power supply 120 is disconnected from the electronic load 140. The self-test apparatus 132 allows a consumer to isolate the power supply 120 from the electronic load and perform error testing on the power supply 120 in isolation; as a result, the consumer can determine with greater certainty whether the problem is in the power supply 120 or in the electronic load 140 without incurring the expense of a technician visit or sending the power supply 120 in for testing.

The self-test apparatus 132, in one embodiment, is physically separate from the other components of the power supply 120 and is inserted into or connected internally to the power supply 120. In another embodiment, the self-test apparatus 132 is incorporated generally into the power supply 120 and makes use of existing power supply 120 facilities to perform its functions. For example, in one embodiment many components of the self-test apparatus 132 are implemented in the microcontroller 122.

The electronic load 140 connects to the output terminal of the power supply 120, from which it draws the power it needs to operate. The electronic load 140 may be any one of the numerous electronic devices in our modern world. For example, the electronic load 140 may be a blade center, a desktop computer, or an appliance such as a television. The electronic load 140 may be a laptop computer or a cell phone, in which case the power supply 120 could be implemented as an adapter. The electronic load 140, in one embodiment, encompasses the power supply 120.

Figure 2:
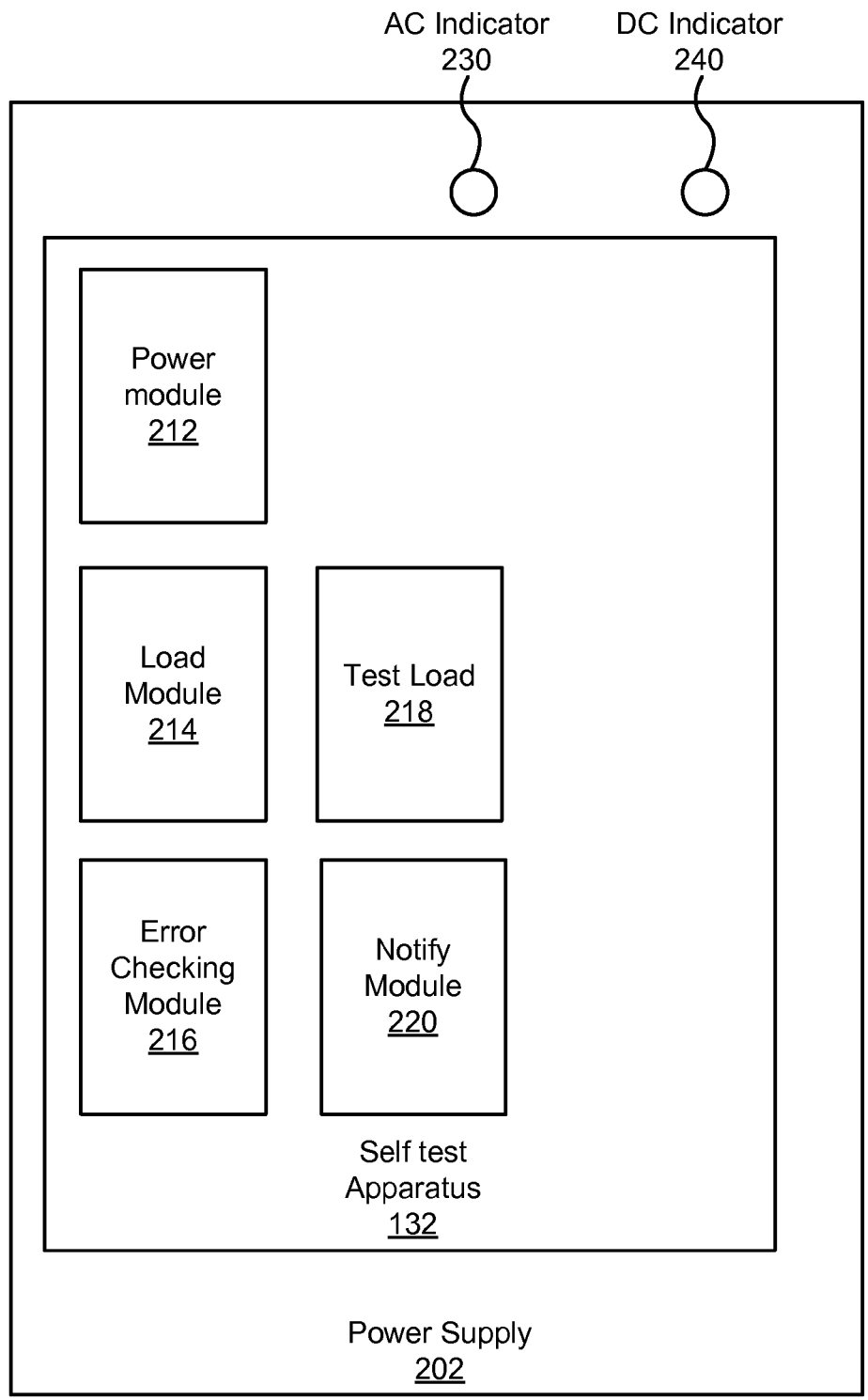
FIG. 2 is a schematic block diagram showing an embodiment of a power supply system in accordance with the present invention.

FIG. 2 illustrates one embodiment of the power supply 202 having a self-test apparatus 132. The power supply 202 depicted in FIG. 2 is a particular embodiment of the power supply 120 described in relation to FIG. 1 and is substantially similar to the power supply 120 described in relation to FIG. 1. The embodiment depicted in FIG. 2 shows the power supply 202 having an AC indicator 230 that corresponds to the input indicator 128 of FIG. 1. Similarly, the DC indicator 240 corresponds to the output indicator 130 of FIG. 1. In one embodiment, the AC indicator 230 and the DC indicator 240 are LEDs that are lit when expected voltages appear at the input and output respectively of the power supply 202.

The power supply 202 also includes a self-test apparatus 132 as described above in connection with FIG. 1. The self-test apparatus 132 includes a power module 212, a load module 214, an error checking module 216, a test load 218, and a notify module 220, which are described below.

The power module 212 determines whether the power supply 202 is in a self-test condition that triggers internal error checking. In one embodiment, the power supply 202 is in self-test condition when the power supply 202 is connected to an input power source, such as the input 110, and is also disconnected from the electronic load 140. The power supply 202 may directly determine the connection status itself, or may receive signals from other components of the power supply 202 indicating that the self-test conditions are met.

The power module 212 may determine that the power supply 202 is connected to an input power source by measuring a voltage at the input 110, measuring input power to the power supply 202, and the like. Similarly, the power module 212 may determine that the load 140 is connected to the power supply 202 by measuring output current, output power, load impedance, etc. One of skill in the art will recognize other ways that the power module 212 may determine that an input power source is connected ant the load 140 is disconnected.

The load module 214 connects a test load 218 to the power supply 202 when the power module 212 determines that the power supply 202 is in the self-test condition. In one embodiment, this connection to the test load 218 is made electrically using a switch such as a MOSFET or BJT, as discussed in greater detail in connection with FIG. 4. The test load 218 is internal to the power supply 202 and presents a predetermined level of impedance to the power supply 202 when the load module 214 connects it. In one embodiment, the test load 218 is connected to the output terminals of the power supply 202.

The self-test apparatus 132 also includes an error checking module 216. The error checking module 216 performs one or more error check operations on the power supply 202 when the power supply 202 is connected to the test load 218. These error check operations determine whether or not there are faults present in the power supply 202. The error checking module 216 may also operate and perform error checking operations on the power supply 202 while it is connected to the electronic load 140. In one embodiment, one of the error checking operations involves determining whether or not the power supply 202 is providing an expected regulated voltage value at the output terminal of the power supply 202. The error checking module 216 may use a different regulated voltage value based on whether the power supply 202 is connected to the electronic load 140 or the internal test load 218.

In the event that the error checking module 216 determines that there are one or more faults in the power supply 202, the notify module 220 actuates an indicator to show that there is a problem. In one embodiment, the indicator is the DC indicator 240. Actuating the indicator may involve switching the DC indicator 240 to an off state. In one embodiment, the DC indicator 240 is an LED and when the power supply 202 stops providing an expected voltage, the DC indicator 240 is turned from "on" to "off." In another embodiment, the notify module 220 causes the DC indicator 240 to blink. In another embodiment, the notify module 220 turns of the DC indicator 240 or causes it to blink and also transmits an error message. One of skill in the art will recognize other ways that the notify module 220 can actuate an indicator to show that the power supply 202 has a problem.

When the user removes the power supply 202 from the electronic load 140 and attaches the power supply 202 to an input 110 (or leaves it attached), the power supply 202 performs one or more self-test operations using the test load 218 that is internal to the power supply 202. Errors in the electronic device 140 do not affect the functioning of the power supply 202 when it is thus isolated from the electronic device 140, and a user can determine with a high degree of confidence whether the problem lies with the power supply 202 or the electronic load 140.

Figure 3:
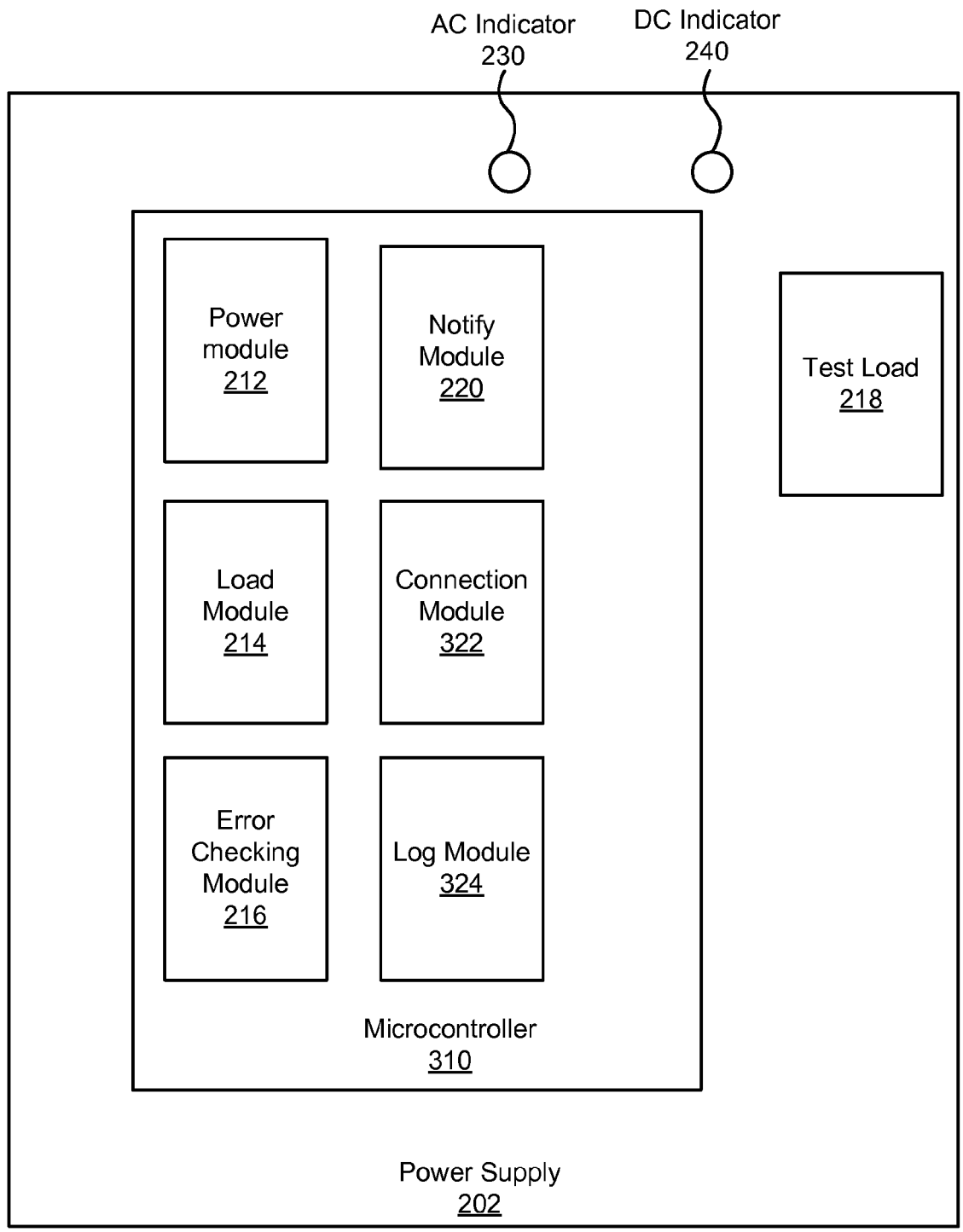
FIG. 3 is a schematic block diagram showing an additional embodiment of a power supply system in accordance with the present invention.

FIG. 3 shows a power supply 202 in a second embodiment and with additional modules. The power supply 202 includes a microcontroller 310. In the depicted embodiment, the power module 212, load module 214, error checking module 216, and notify module 220 are implemented in the microcontroller 310 along with a connection module 322 and a log module 324. The test load 218 is implemented external to the microcontroller 310. The power module 212, load module 214, error checking module 216, and notify module 220 are substantially similar to those described above in relation to FIG. 2.

The connection module 322 determines whether the power supply 202 is connected to the electronic load 140. If the power supply 202 is disconnected, the connection module 322 provides a self-test signal to the power module 212. If the power module 212 receives this signal and the power supply 202 is connected to the input 110, the power module 212 determines that the power supply 202 is in self test mode and the internal error checking described above occurs. In one embodiment, the determination of whether or not the power supply 202 is connected to the electronic load 140 is made using a pin that shorts when the power supply 202 is connected to the electronic load 140 such that both the electronic load 140 and the power supply 202 are aware of each other's presence. In alternative embodiments, the connection is detected using electronic handshaking through a connector, a mechanical sensor, or other detection methods and devices known to those of skill in the art.

The microcontroller 310 may also include a log module 324. The log module 324 logs in memory errors reported by the error checking module 216. In one embodiment, the log module 324 logs errors both when the power supply 202 is disconnected from the electronic load 140 and in self-test mode, and when the power supply 202 is connected to the electronic load 140 and detecting errors. The log module 324 may further log commands from the electronic load 140 to turn off the power supply 202. In one embodiment, the log module 324 stores the error reports in non-volatile memory such as flash memory. The error reports may be useful in determining the nature of the problem with the power supply 202 or the electronic load 140. In a further embodiment, the log module 324 communicates these errors over a communications bus such as an I²C bus.

For example, the log module 324 may log information such as the time at which the error occurred, the device status at the time of the error, input or output voltage values, current values, and component states. The log module 324 may also log error events reported to the power supply 120 from the electronic load 140. Those of skill in the art will appreciate that a wide range of values may be stored in non-volatile memory by the log module 324 that could be helpful in diagnosing problems with the power supply 120 or the electronic load 140.

Figure 4:
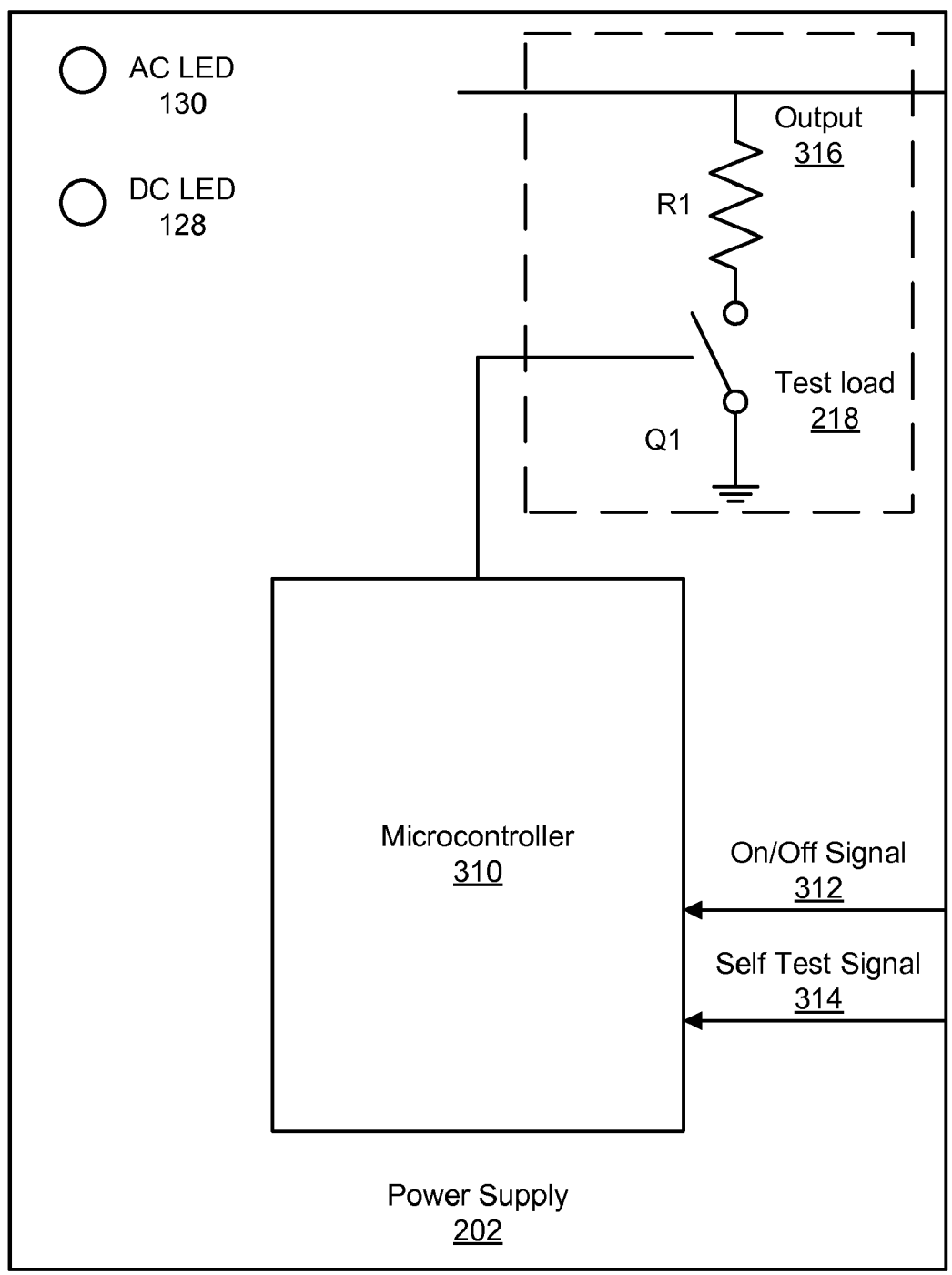
FIG. 4 is a schematic block diagram showing an additional view of a power supply system in accordance with the present invention.

FIG. 4 provides an additional perspective of a power supply 202 having an AC LED 130, a DC LED 128, a microcontroller 310, and a test load 218. The microcontroller 310 implements the various modules described in connection with FIGS. 2 and 3. In the depicted embodiment, the microcontroller 310 receives an on/off signal 312 directing the microcontroller 310 to turn the power supply 202 either on or off. The on/off signal 312 may come from the electronic load 140 that communicates with the power supply 202. In an alternative embodiment, the power supply 202 has an on/off switch that a user may actuate. This on/off switch provides the on/off signal 312. The power supply 202 may also have both an on/off switch and the necessary components to allow the electronic load 140 to provide the on/off signal 312.

The microcontroller 310 also receives a self test signal 314. The self test signal 314 may, for example, be provided by a pin that shorts or opens when the power supply 202 is disconnected from the electronic load 140, as described above. In an alternative embodiment, the self test signal 314 may be provided by a switch. In such an embodiment, the user can manually provide the self test signal 314 such that the internal error checking procedure described above takes place.

Also shown in FIG. 4 is the test load 218. The test load 218 includes a switch Q1 and a resistor R1 in the depicted embodiment. As described above, the test load 218 provides a predetermined level of impedance when the test load 218 is connected to the output 316 of the power supply 202. Those of skill in the art will appreciate that a variety of configurations may be used to provide the necessary impedance, and that the test load 218 is not limited to the embodiment disclosed in FIG. 4.

In one embodiment, the switch Q1 may be a metal-oxide-semiconductor field effect transistor (MOSFET). Other switching components or configurations could also be used including, but not limited to, bipolar junction transistors (BJTs). In one embodiment, when the power supply 202 is connected to the electronic load 140, the switch Q1 is left open such that the test load 218 circuit is incomplete. The test load 218 is thus effectively disconnected from the power supply 202. When the power supply 202 is disconnected from the electronic load 140, and the power module 212 determines that the power supply 202 is in self test condition, the load module 214 in the microcontroller 310 sends a signal to the switch Q1 closing the switch and connecting the test load 218. In one embodiment, the load module 214 provides a gate signal with a very small duty cycle to load the power supply 202 when it is in self test mode. In response, the error checking module 216 performs the error check operations on the power supply 202 based on its output when connected to the test load R1 of the test load 218. Thus the modules described above perform necessary testing on the power supply 202 autonomously and without the need for an external load.

If the error checking module 216 determines that there are faults in the power supply 202 based on the results of the test operations performed while the power supply 202 is connected to the test load 218, the notify module 220 turns off the DC LED 128. Since the DC LED 128 is off, the user will be alerted to the fact that there is a problem in the power supply 202, and can take appropriate action to have it repaired.

Figure 5:
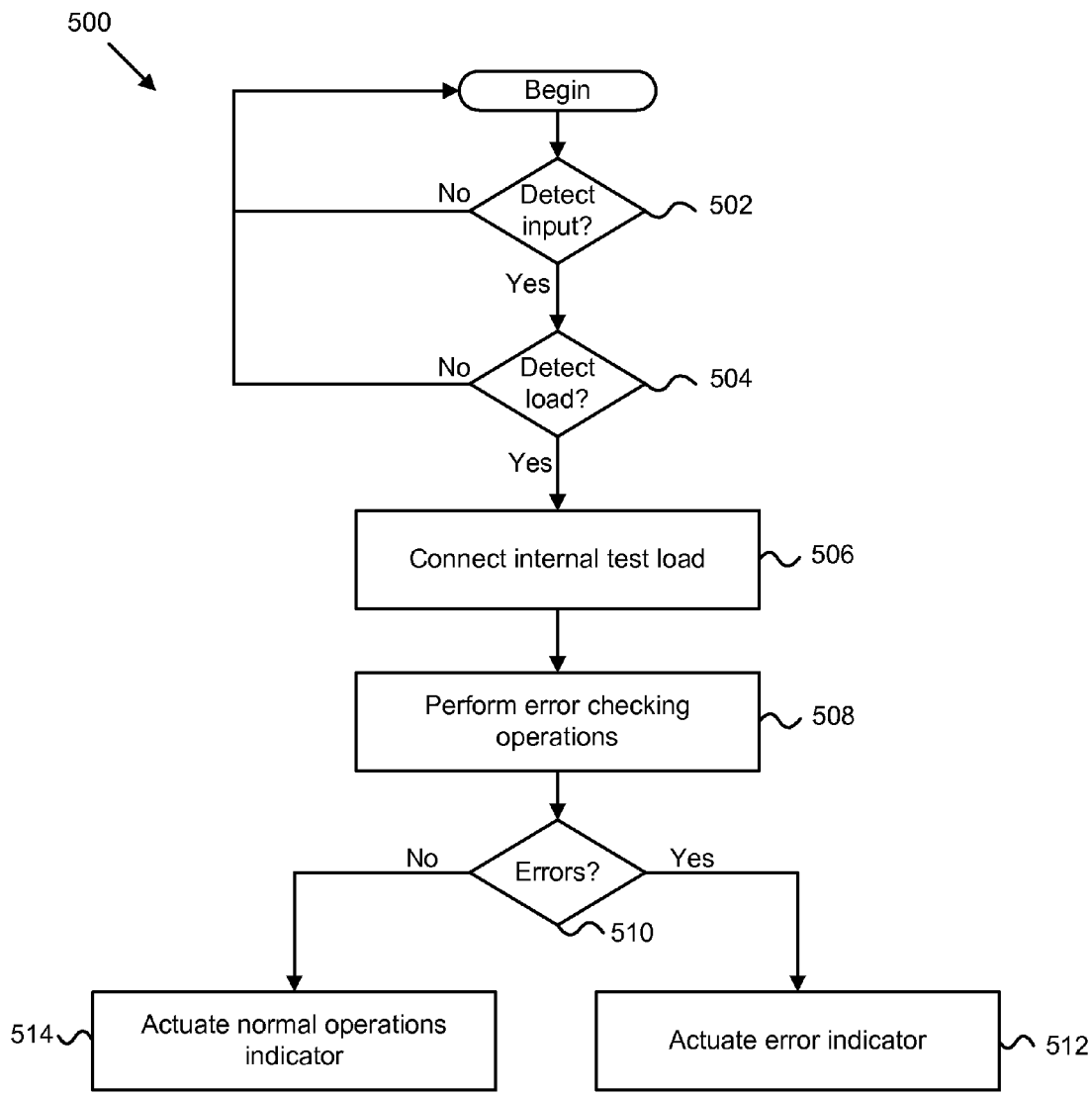
FIG. 5 is a schematic flow chart diagram illustrating a method for detecting errors in a power supply.

FIG. 5 illustrates a method 500 for performing a self test operation in a power supply 202. While the following description describes various modules performing the steps shown in FIG. 5, the method 500 is not limited to any particular module or component performing a given step. The steps are independent of any particular implementation, and the described implementation is simply exemplary.

The method 500 begins with the connection module 322 detecting 502 an input to the power supply 202. In one embodiment, this input is an AC input voltage provided by a connection to one of a variety of standard power sources. If the connection module 322 does not detect an input, the monitoring continues. When the connection module 322 does detect an input, it then detects 504 whether or not a load, such as the electronic load 140, is connected to the power supply 202. If the load is not detected, the monitoring continues. While the detection steps 502 and 504 are shown as serial steps, those of skill in the art will appreciate that the steps may also be performed in parallel, such that the method 500 continues to step 506 when both conditions are satisfied.

If the connection module 322 detects the presence of both the input 110 and the electronic load 140, the power module 212 determines that the power supply 202 is in self-test mode and the load module 214 connects 506 the internal test load 218. The error checking module 216 then performs 508 error checking operations on the power supply 202 to determine whether or not the power supply 202 is operating error free. If the error checking module 216 determines 510 that there are no errors, the notify module 220 actuates 514 an indicator signaling that the power supply 202 is operating normally. If there are errors, the notify module 220 actuates 512 an indicator signaling that there are one or more errors in the power supply 202 and that appropriate action is required.

In one embodiment, the notify module 220 uses only a single indicator to indicate the error status of the power supply 202. For example, the power supply 202 may have a DC LED 128 that acts as an indicator. If there are errors, the notify module 220 turns the DC LED 128 off and keeps the DC LED 128 off. If the power supply 202 is working normally, the notify module 220 turns the DC LED 128 on and maintains that on state until an error is detected. In other embodiments, the power supply 202 has separate indicators that are actuated to reflect normal operations or the presence of errors.

Figure 6:
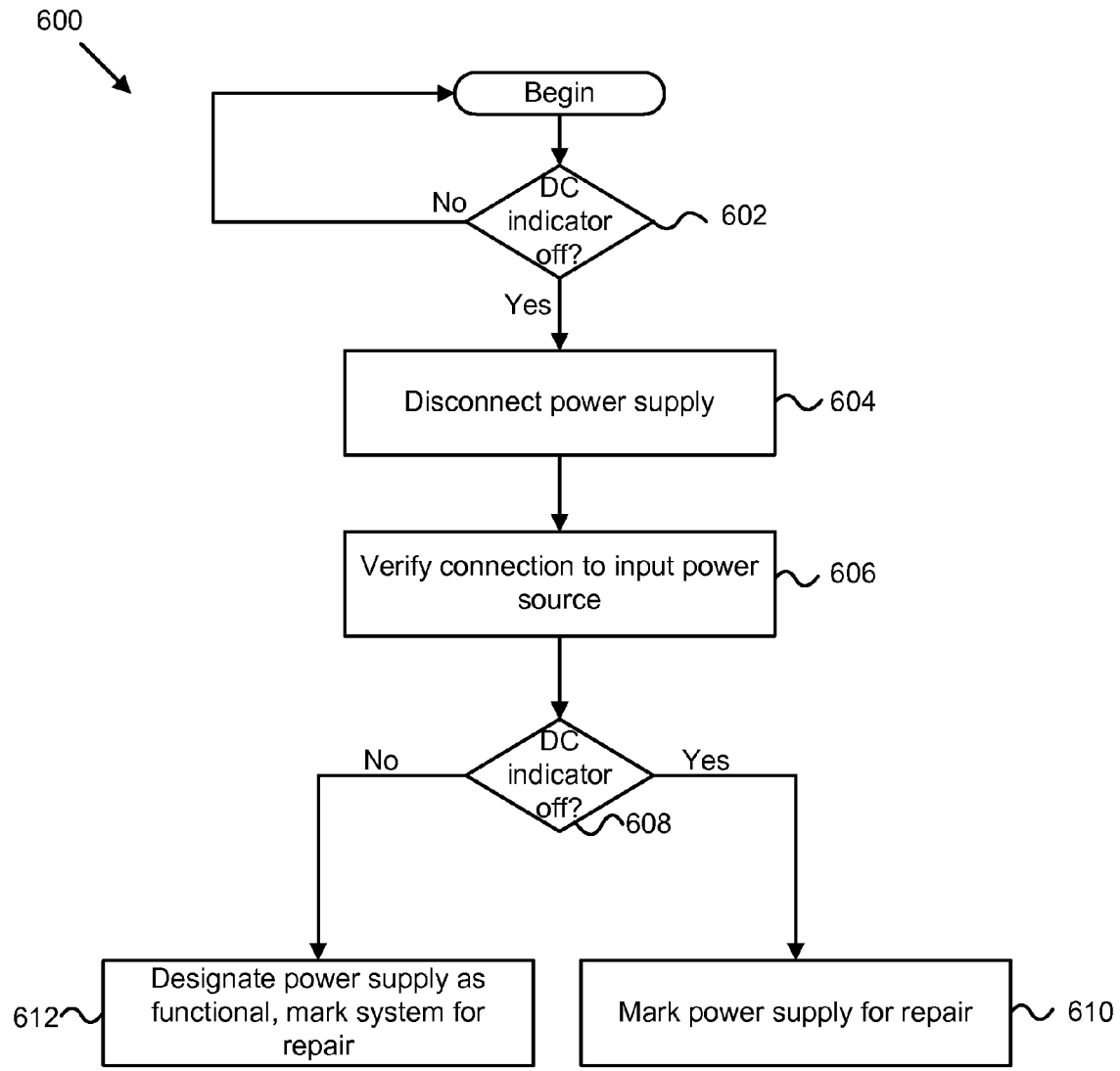
FIG. 6 is a schematic flow chart diagram illustrating a method for determining that the power supply is faulty.

FIG. 6 illustrates an exemplary method 600 for testing a power supply 202 for errors where the power supply 202 has internal error checking. The method 600 begins with a user determining 602 whether or not a DC indicator 240 is on or off. If the DC indicator 240 is on, the user is may determine 602 that the power supply 202 and the electronic load 140 are respectively giving and receiving an expected output from the output terminal of the power supply 202. The user simply continues to monitor the power supply 202.

If the DC indicator 240 is off, then the user determines 602 that there is a problem in either the power supply 202 or the electronic load 140 that is causing the power supply 202 to provide an unexpected output value. The user then disconnects 604 the power supply 202 and isolates it from the electronic load 140. Disconnecting the load may involve physically removing the power supply 202 from the electronic load 140, or activating a switch on the power supply 202 that electrically isolates the power supply 202 from the electronic load 140.

With the power supply 202 physically removed or electrically disconnected from the electronic load 140 as described above, the user verifies 606 that the power supply 202 is connected to an input power source, such as the input 110. Where the power supply 202 includes an input indicator 128 such as the AC indicator 230, the user may verify both the physical connection to the input power source and that the input 110 is providing an expected value to the power supply 202, which is typically manifest by the AC indicator 230 providing a signal, such as being lit.

With the connection between the input 110 and the power supply 202 established, and with the power supply 202 disconnected from the electronic load 140, the power supply 202 is in self test mode. The power supply 202 thus runs a series of tests on itself using the internal test load 218, and provides notification of the results as described extensively above. The user examines the indicator of the results. For example, where the indicator is the DC indicator 240, the user determines 608 whether the DC indicator 240 is on or off once power supply 202 is placed in the self test condition. In one embodiment, the notification is provided via the DC indicator 240 almost instantaneously; in other embodiments, the user may need to wait for some small period of time for the DC indicator 240 to indicate an accurate picture of the power supply 202's status.

If the DC indicator 240 is off or blinking, the user can determine with some confidence that the problem lies with the power supply 202 and can mark 610 the power supply 202 for repair. This may involve making a service call, or sending the power supply 202 to a service center. If the DC indicator 240 is on, the user determines that the power supply 202 is likely functional, and that some error in the system is causing the power supply 202 to function improperly. Thus, the user can designate 612 the power supply as functional and mark the system for repair.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for error checking in a power supply, the apparatus comprising: a power module that determines that a power supply is in a self-test condition, wherein the self-test condition comprises the power supply being connected to an input power source and the power supply being disconnected from an electronic load; a load module that connects a test load to the power supply in response to a determination by the power module that the power supply is in the self-test condition, wherein the test load is internal to the power supply; an error checking module that performs one or more error check operations on the power supply connected to the test load, the error checking module further performing one or more error check operations while the power supply is connected to the electronic load, wherein the error check operations determine the presence or absence of one or more faults in the power supply using the results of the error check operations performed on the test load while the power supply is disconnected from said electronic load and wherein the error check operations determine the presence or absence of one or more faults in the power supply using the results of the error check operations performed while the power supply is connected to the electronic load; a notify module that actuates an indicator in response to the error checking module determining that one or more faults are present in the power supply; and a log module that records error messages reported from error check operations executed when the power supply is connected to the electronic load and when the power supply is connected to the test load in non-volatile memory, wherein at least one of said power module, load module, error checking module, notify module and log module is implemented in hardware.

2. The apparatus of claim 1, further comprising a connection module that determines that the power supply is one of connected to the electronic load and disconnected from the electronic load, the connection module further providing a self-test signal in response to the power supply being disconnected from the electronic load.

3. The apparatus of claim 2, wherein the power module determines that the power supply is in a self-test condition in response to receiving the self-test signal from the connection module while the power supply is connected to the input power source.

4. The apparatus of claim 1, wherein the power supply being disconnected from the electronic load comprises one of the power supply being physically removed from the electronic load and the power supply being electrically disconnected from the electronic load.

5. The apparatus of claim 1, wherein the power supply further comprises an AC indicator that is actuated in response to the presence of an AC input and a DC indicator that is actuated in response to a determination that the power supply is providing an expected DC output to a load.

6. The apparatus of claim 5, wherein the notify module actuates the DC indicator in response to the error checking module determining that one or more faults are present in the power supply.

7. The apparatus of claim 6, wherein the DC indicator is an LED, and wherein actuating the DC indicator comprises setting the DC indicator to an off state.

8. The apparatus of claim 1, wherein the one or more error check operations comprises determining whether the power supply is providing an expected regulated voltage value at the output terminal of the power supply while the power supply is connected to the test load.

9. A system for error checking in a power supply, the system comprising: a power supply that provides a regulated output voltage to an electronic load; a test load that provides a predetermined level of impedance, wherein the test load is internal to the power supply; a power module that determines that a stand-alone power supply is in a self-test condition, wherein the self-test condition comprises the power supply being connected to an input power source and the power supply being disconnected from the electronic load; a connection module that sends the power module a self-test signal in response to the power supply being disconnected from the electronic load; a load module that electrically connects the test load to the power supply in response to a determination by the power module that the power supply is in the self-test condition; an error checking module that performs one or more error check operations on the power supply connected to the test load in response to the load module electrically connecting the test load, the error checking module further performing one or more error check operations while the power supply is connected to the electronic load, wherein the error check operations determine the presence or absence of one or more faults in the power supply using the results of the error check operations performed on the test load while the power supply is disconnected from said electronic load and wherein the error check operations determine the presence or absence of one or more faults in the power supply using the results of the error check operations performed while the power supply is connected to the electronic load; a notify module that actuates an indicator in response to the error checking module determining that one or more faults are present in the power supply; and a log module that records error messages reported from error check operations executed when the power supply is connected to the electronic load and when the power supply is connected to the test load in non-volatile memory.

10. The system of claim 9, further comprising the electronic load wherein the electronic load is one of a computer, a blade system, and an appliance.

11. The system of claim 9, wherein the power supply receives one of a direct current input and an alternating current input, and provides one of a direct current output and an alternating current output.

12. The system of claim 9, wherein the notify module actuates a DC indicator in response to a determination that one or more faults are present in the power supply.

13. A computer program product, comprising instructions stored in a non-transitory computer readable storage medium, for checking a power supply for errors, the computer program product comprising instructions for: determining that a power supply is in a self-test condition, wherein the self-test condition comprises the power supply being connected to an input power source and the power supply being disconnected from an electronic load; connecting a test load that is internal to the power supply to an output terminal of the power supply in response to a determination that the power supply is in the self-test condition; performing one or more error check operations on the power supply connected to the test load and performing one or more error check operations while the power supply is connected to the electronic load, wherein the error check operations determine the presence or absence of one or more faults in the power supply using the results of the error check operations performed on the test load while the power supply is disconnected from said electronic load and wherein the error check operations determine the presence or absence of one or more faults in the power supply using the results of the error check operations performed while the power supply is connected to the electronic load; actuating an indicator in response to the error checking module determining that one or more faults are present in the power supply; and recording error messages reported from error check operations executed when the power supply is connected to the electronic load and when the power supply is connected to the test load in non-volatile memory.

14. The computer program product of claim 13, further comprising instructions for determining whether the power supply is connected to the electronic load and providing a self-test signal in response to the power supply being disconnected to the electronic load.

15. The computer program product of claim 14, wherein the power supply is transitioned to the self-test condition in response to receiving the self-test signal while the power supply is connected to the AC input power source.

16. The computer program product of claim 14, wherein one of the error check operations comprises determining that the power supply is providing an expected regulated voltage at the output terminal of the power supply while the power supply is connected to the test load.

17. A method for checking a power supply for errors, the method comprising: determining that a power supply is in a self-test condition, wherein the self-test condition comprises the power supply being connected to an input power source and the power supply being disconnected from an electronic load; connecting a test load internal to the power supply in response to a determination that the power supply is in the self-test condition, wherein the test load is internal to the power supply; performing one or more error check operations on the power supply connected to the test load and performing one or more error check operations while the power supply is connected to the electronic load, wherein the error check operations determine the presence or absence of one or more faults in the power supply using the results of the error check operations performed on the test load while the power supply is disconnected from said electronic load and wherein the error check operations determine the presence or absence of one or more faults in the power supply using the results of the error check operations performed while the power supply is connected to the electronic load; actuating an indicator in response to the error checking module determining that one or more faults are present in the power supply; and recording error messages reported from error check operations executed when the power supply is connected to the electronic load and when the power supply is connected to the test load in non-volatile memory.

18. The method of claim 17, wherein the indicator is a DC indicator LED, and wherein an individual determines that the power supply is in need of repair by:
   determining that the DC indicator LED of the power supply is in an off state when the power supply is connected to the electronic load;
   removing the power supply from the electronic load;
   having the power supply connected to the input power source while the power supply is not connected to the electronic load such that the power supply is in the self-test condition and the test load is connected; and
   designating the power supply as needing repair in response to the DC indicator LED maintaining the off state.

* * * * *